(12) United States Patent
Yoo (10) Patent No.: US 12,406,827 B2
(45) Date of Patent: Sep. 2, 2025

(54) MICROSCOPIC SPECIMEN AND ANALYSIS METHOD THEREOF USING MICROSCOPE

(71) Applicant: Sogang University Research & Business Development Foundation, Seoul (KR)

(72) Inventor: Hyobin Yoo, Seoul (KR)

(73) Assignee: Sogang University Research & Business Development Foundation, Seoul (KR)

( * ) Notice: Subject to any disclaimer, the term of this patent is extended or adjusted under 35 U.S.C. 154(b) by 405 days.

(21) Appl. No.: 18/184,761

(22) Filed: Mar. 16, 2023

(65) Prior Publication Data

US 2023/0307208 A1    Sep. 28, 2023

(30) Foreign Application Priority Data

Mar. 23, 2022  (KR) .................. 10-2022-0036294
Aug. 25, 2022  (KR) .................. 10-2022-0107068

(51) Int. Cl.
  *H01J 37/28*   (2006.01)
  *H01J 37/20*   (2006.01)
  *H01J 37/244*  (2006.01)

(52) U.S. Cl.
  CPC .............. *H01J 37/28* (2013.01); *H01J 37/20* (2013.01); *H01J 37/244* (2013.01)

(58) Field of Classification Search
  CPC .......... H01J 37/28; H01J 37/20; H01J 37/244; H01J 37/26; H01J 37/295; H01J 2237/2008; G01N 23/2251
  USPC ................ 250/306, 307, 310, 311
  See application file for complete search history.

(56) References Cited

U.S. PATENT DOCUMENTS

| | | | |
|---|---|---|---|
| 9,716,295 B2 | 7/2017 | Jung et al. | |
| 10,636,581 B2 | 4/2020 | Kobayashi et al. | |
| 11,817,564 B2 | 11/2023 | Jung et al. | |
| 2010/0193398 A1* | 8/2010 | Marsh | H01J 37/20 29/428 |
| 2012/0298883 A1* | 11/2012 | Grogan | H01J 37/28 156/60 |
| 2018/0372672 A1* | 12/2018 | Walden, II | H01J 37/20 |

(Continued)

FOREIGN PATENT DOCUMENTS

| | | |
|---|---|---|
| CN | 104237567 A | 12/2014 |
| KR | 10-2016-0129612 A | 11/2016 |

(Continued)

OTHER PUBLICATIONS

Rebecca Engelke et al., Topologically protected moiré domainantiferroelectrics in twisted van der Waals homobilayers, Park Group @ Harvard (2022).

(Continued)

*Primary Examiner* — Jason L McCormack
(74) *Attorney, Agent, or Firm* — Harness, Dickey & Pierce, P.L.C.

(57) ABSTRACT

Provided is a microscopic specimen including a lower plate that includes a lower opening portion, an upper plate that covers the lower opening portion, a target material layer on the upper plate, a lower electrode layer between the upper plate and the target material layer, an upper electrode layer on the target material layer, and a wiring pattern electrically connected to each of the upper electrode layer and the lower electrode layer.

20 Claims, 8 Drawing Sheets

(56) References Cited

U.S. PATENT DOCUMENTS

2019/0074498 A1    3/2019  Chung et al.
2019/0237295 A1*   8/2019  Camino .................. H01J 37/26

FOREIGN PATENT DOCUMENTS

| KR | 10-2018-0037064 A | 4/2018 |
| KR | 2020-0033192 A | 3/2020 |
| KR | 20210026997 A | 3/2021 |

OTHER PUBLICATIONS

B. L. Mehdi, et al., Observation and Quantification of Nanoscale Processes in Lithium Batteries by Operando Electrochemical (S)TEM, 10.1021/acs.nanolett.5b00175 (DOI) Nano Lett. 2015.

* cited by examiner

MICROSCOPIC SPECIMEN AND ANALYSIS METHOD THEREOF USING MICROSCOPE

CROSS-REFERENCE TO RELATED APPLICATIONS

This U.S. non-provisional patent application claims priority under 35 U.S.C. § 119 of Korean Patent Application Nos. 10-2022-0036294, filed on Mar. 23, 2022, and 10-2022-0107068, filed on Aug. 25, 2022, the entire contents of which are hereby incorporated by reference.

BACKGROUND

The present disclosure herein relates to a microscopic specimen and an analysis method thereof using a microscope, and more particularly, to a multilayer microscopic specimen including a target material layer, and a method of analyzing the target material layer of the multilayer microscopic specimen using a microscope.

As the modern industry highly develops, the trend of high integration of electronic devices, etc., increases. The high integration of the electronic devices, etc., requires the development of various analysis methods utilizable in the development of the electronic devices, etc. Representative examples of such analysis methods include analyses of material structures, etc., through an electron microscope. Among the analyses, an analysis method through an electron microscope, which analyzes a diffraction pattern obtained by allowing electrons to pass through a specimen, is widely utilized. Such a method requires machining of a specimen to a thin thickness so that electrons may effectively pass through the specimen. Accordingly, utilizing the electron microscope entails using a destructive method to prepare a specimen. As the structure of the specimen is newly machined, an actual driving environment of electronic devices is difficult to realize.

SUMMARY

The present disclosure provides a microscopic specimen, in which an actual driving environment of semiconductor devices, or the like, is realized, and a method of analyzing the microscopic specimen using a microscope.

The present disclosure also provides a microscopic specimen, with which changes in structure of a target material layer according to an external factor is analyzable in real time, and a method of analyzing the microscopic specimen using a microscope.

The objectives of the present invention are not limited to the aforesaid, but other objectives not described herein would be clearly understood by those skilled in the art from descriptions below.

An embodiment of the inventive concept provides a microscopic specimen including a lower plate that includes a lower opening portion, an upper plate that covers the lower opening portion, a target material layer on the upper plate, a lower electrode layer between the upper plate and the target material layer, an upper electrode layer on the target material layer, and a wiring pattern electrically connected to each of the upper electrode layer and the lower electrode layer.

In an embodiment of the inventive concept, an analysis method may include a process (a) of disposing a specimen in a microscope, a process (b) of emitting an electron beam passing through the specimen, and a process (c) of obtaining analysis information from a diffracted electron beam of the passed electron beam. The specimen may include a lower plate that includes a lower opening portion, an upper plate that covers the lower opening portion, a target material layer on the upper plate, and a lower electrode layer between the upper plate and the target material layer. In the process (b), the electron beam may pass through the target material layer, the lower electrode layer, the upper plate, and the lower plate in sequence.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIGS. 2 to 7 are views illustrating a specimen according to an embodiment of the inventive concept, where

DETAILED DESCRIPTION

Hereinafter, embodiments of the inventive concept will be described in detail with reference to the accompanying drawings.

Figure 1:
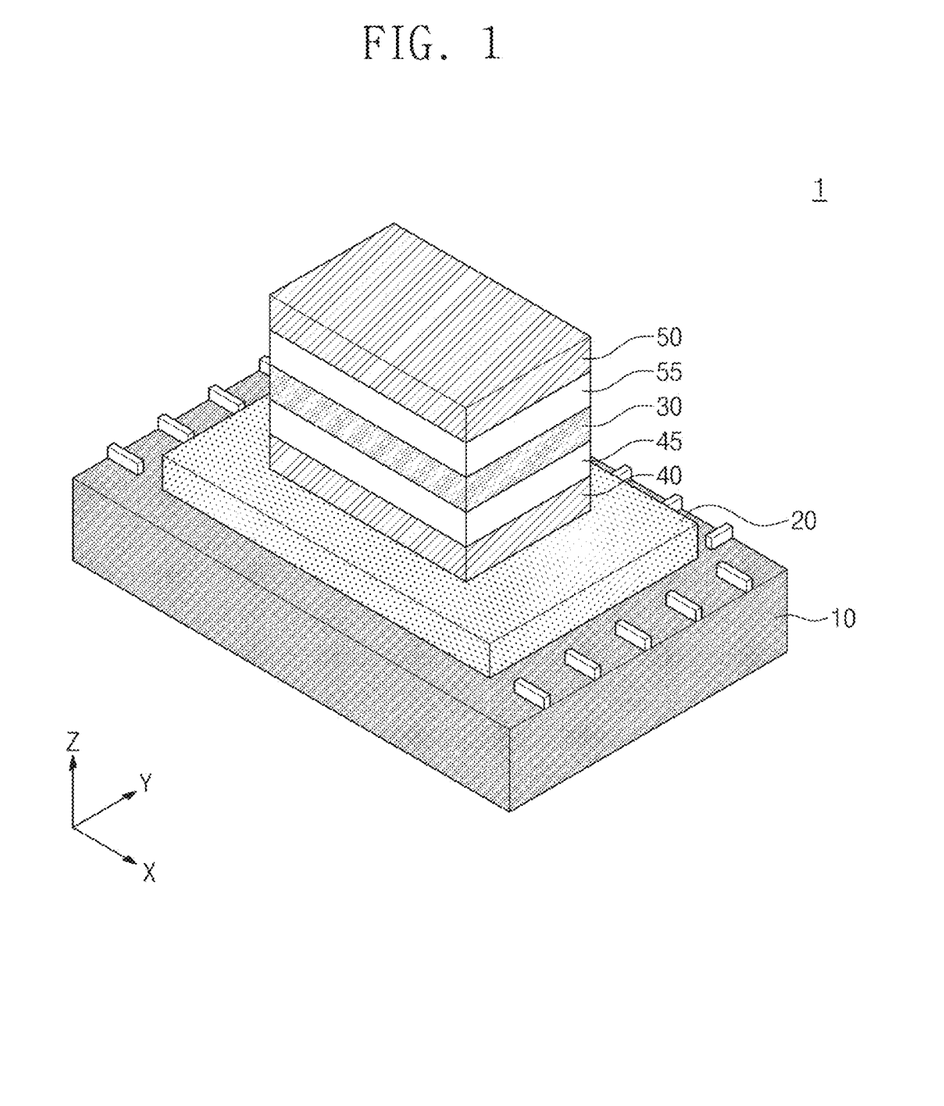
FIG. 1 is a perspective view illustrating a specimen according to an embodiment of the inventive concept.
Figure 2:
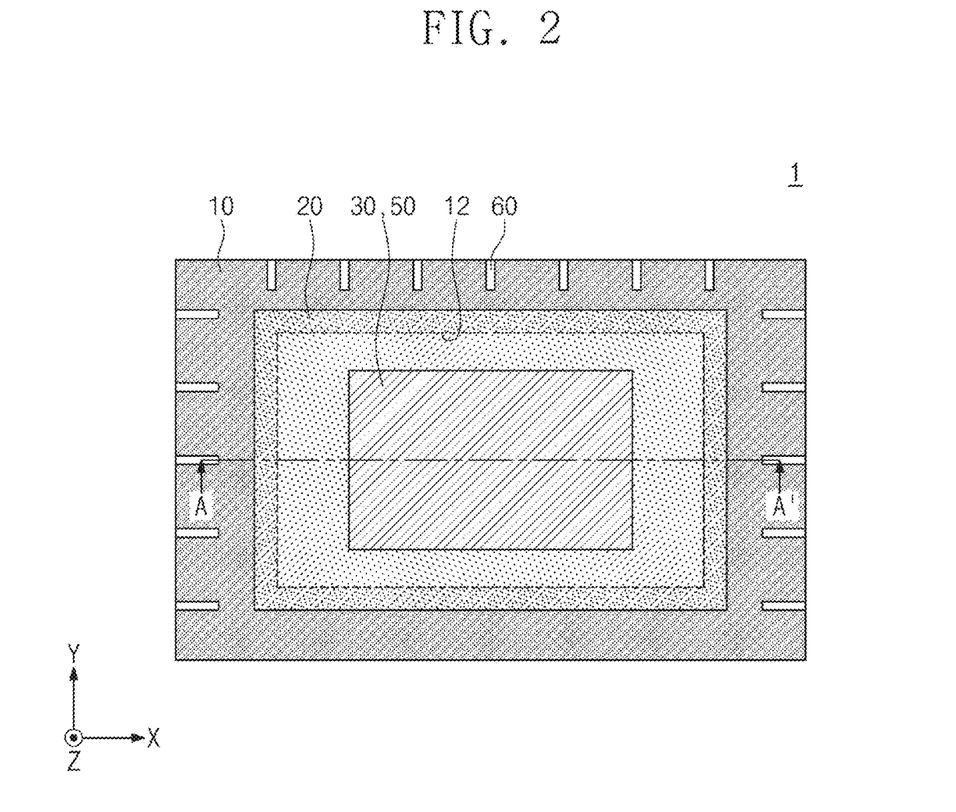
FIGS. 2, 4 and 6 are plan views of a specimen according to an embodiment of the inventive concept.
Figure 3A:
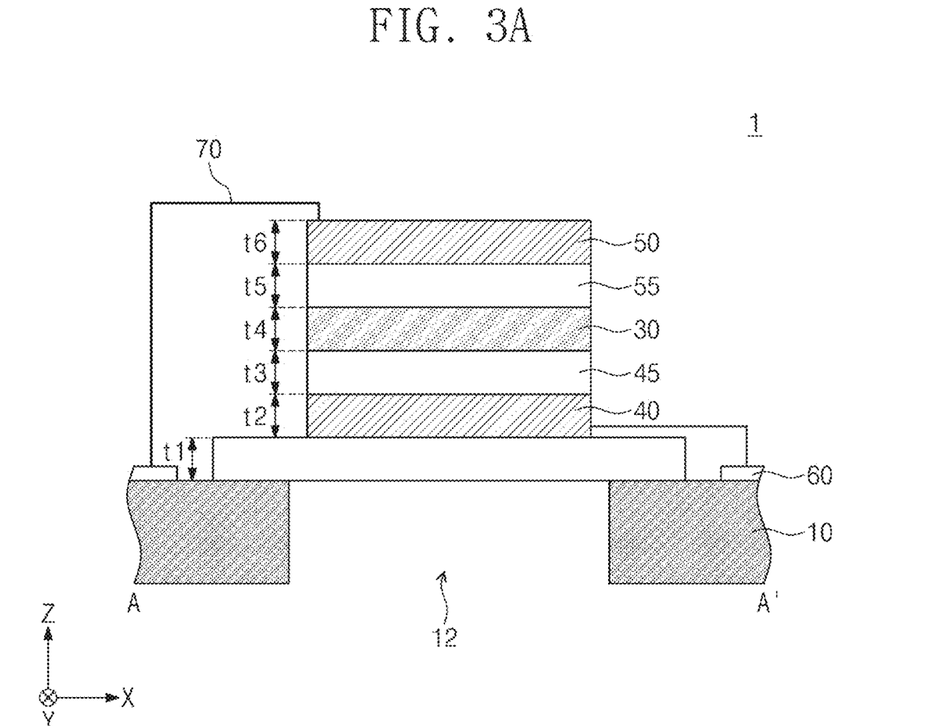
FIGS. 3A and 3B are cross-sectional views corresponding to line A-A' in FIG. 2.
Figure 3B:
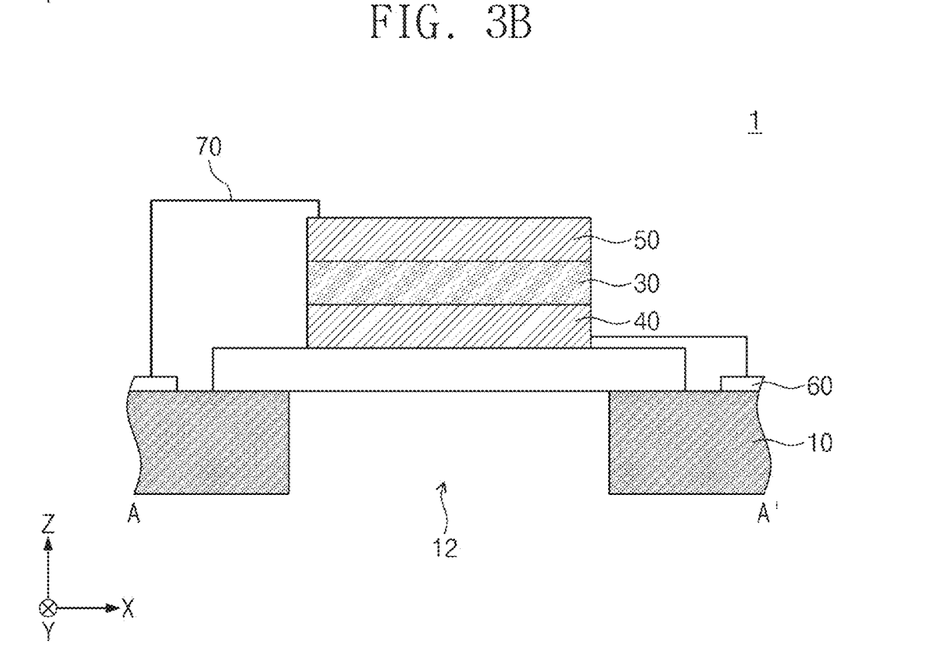

FIG. 1 is a perspective view illustrating a specimen according to an embodiment of the inventive concept. FIG. 2 is a plan view of a specimen according to an embodiment of the inventive concept. FIGS. 3A and 3B are cross-sectional views corresponding to line A-A' in FIG. 2.

Referring to FIGS. 1 to 3A, a specimen 1 may be provided which is used in performing an analysis method using a microscope. The microscope may be an electron microscope. For example, the microscope may be any one of a transmission electron microscope (TEM) and a scanning transmission electron microscope (STEM), but is not limited thereto.

The specimen 1 may include a lower plate 10, an upper plate 20, a target material layer 30, a lower electrode layer 40, an upper electrode layer 50, and a wiring pattern 60. The lower plate 10 may include a lower opening portion 12 passing therethrough. The lower opening portion 12 may be an empty space extending from a top surface to a bottom surface of the lower plate 10, and may be provided in plurality. The lower plate 10 may include, for example, silicone, but is not limited thereto.

The upper plate 20 may be disposed on the lower plate 10. The upper plate 20 may cover the lower opening portion 12 of the lower plate 10, and may extend onto the top surface of the lower plate 10. For example, the upper plate 20 may fully cover the lower plate 10, but is not limited thereto. The upper plate 20 may have a bottom surface that is exposed to the outside by the lower opening portion 12. The upper plate 20 may have a thickness t1 that is, for example, greater than about 0 nm and less than or equal to about 300 nm. As the upper plate 20 has a thin thickness of about 300 nm or less, an electron beam of the microscope may pass through the upper plate 20 in the analysis method to be described later. For example, the upper plate 20 may include a silicon nitride, but is not limited thereto. In one example, the upper plate 20 may include a monocrystalline material, but is not limited thereto. In another example, the upper plate 20 may include an amorphous material.

The target material layer 30 may be disposed on the upper plate 20. In one example, the target material layer 30 may cover at least a portion of a top surface of the upper plate 20. The target material layer 30 may vertically overlap the lower opening portion 12 of the lower plate 10. In one example, the entire area of the target material layer 30 may vertically overlap the lower opening portion 12. In another example, although not illustrated, a portion of the target material layer 30 may vertically overlap the lower opening portion 12. The target material layer 30 may be a layer including a material to be observed through the microscope in the analysis method to be described later.

The target material layer 30 may have a thickness t4 that is, for example, greater than about 0 nm and less than or equal to about 300 nm. As the target material layer 30 has a thin thickness of about 300 nm or less, the electron beam of the microscope may pass through the target material layer 30 in the analysis method to be described later. The target material layer 30 may include at least one of a chalcogenide, a metal oxide, a nitride, graphene, and graphite. For example, the target material layer 30 may include a two-dimensional material such as a transition metal dichalcogenide (TMD). The target material layer 30 may exhibit, for example, ferroelectricity, but is not limited thereto.

The lower electrode layer 40 may be disposed on the upper plate 20. The lower electrode layer 40 may be interposed between the upper plate 20 and the target material layer 30. At least a portion of the target material layer 30 may vertically overlap the lower electrode layer 40. In one example, as illustrated in FIG. 3A, the entire area of the target material layer 30 may vertically overlap the lower electrode layer 40, but an embodiment of the inventive concept is not limited thereto. The lower electrode layer 40 may have a thickness t2 that is, for example, greater than about 0 nm and less than or equal to about 300 nm. As the lower electrode layer 40 has a thin thickness of about 300 nm or less, the electron beam of the microscope may pass through the lower electrode layer 40 in the analysis method to be described later.

The upper electrode layer 50 may be disposed on the target material layer 30. At least a portion of the upper electrode layer 50 may vertically overlap the target material layer 30. In one example, as illustrated in FIG. 3A, the entire area of the upper electrode layer 50 may vertically overlap the target material layer 30. The upper electrode layer 50 may have a thickness t6 that is, for example, greater than about 0 nm and less than or equal to about 300 nm. As the upper electrode layer 50 has a thin thickness of about 300 nm or less, the electron beam of the microscope may pass through the upper electrode layer 50 in the analysis method to be described later.

The lower electrode layer 40 and the upper electrode layer 50 may each include a conductive material. In one example, the lower electrode layer 40 and the upper electrode layer 50 may each include conductive graphite. In another example, the lower electrode layer 40 and the upper electrode layer 50 may each include a conductive metal material (e.g., copper, aluminum, gold, silver, titanium, tungsten, or the like). In one example, each of the lower electrode layer 40 and the upper electrode layer 50 may include at least one of a monocrystalline material and an amorphous material, but is not limited thereto. The lower electrode layer 40 and the upper electrode layer 50 may include the same material or may include different materials.

In one example, a lower insulation layer 45 may be interposed between the lower electrode layer 40 and the target material layer 30, and an upper insulation layer 55 may be interposed between the upper electrode layer 50 and the target material layer 30. The lower insulation layer 45 may separate the lower electrode layer 40 and the target material layer 30 from each other, and the upper insulation layer 55 may separate the upper electrode layer 50 and the target material layer 30 from each other. The lower insulation layer 45 may electrically insulate the lower electrode layer 40 and the target material layer 30 from each other, and the upper insulation layer 55 may electrically insulate the upper electrode layer 50 and the target material layer 30 from each other. The lower insulation layer 45 and the upper insulation layer 55 may each include an insulating material. For example, each of the lower insulation layer 45 and the upper insulation layer 55 may include a hexagonal boron nitride (h-BN), but is not limited thereto. In one example, each of the lower insulation layer 45 and the upper insulation layer 55 may include at least one of a monocrystalline material and an amorphous material, but is not limited thereto. The lower insulation layer 45 and the upper insulation layer 55 may include the same material or may include different materials.

The lower insulation layer 45 and the upper insulation layer 55 may have a thickness t3 and a thickness t5, respectively, each of which is, for example, greater than about 0 nm and less than or equal to about 300 nm. As each of the lower insulation layer 45 and the upper insulation layer 55 has a thin thickness of about 300 nm or less, the electron beam of the microscope may pass through the lower insulation layer 45 and the upper insulation layer 55 in the analysis method to be described later.

The wiring pattern 60 may be electrically connected to each of the lower electrode layer 40 and the upper electrode layer 50. In one example, the wiring pattern 60 may be disposed on the lower plate 10 (e.g., a portion of the lower plate 10, which is not covered by the upper plate 20), but is not limited thereto. In one example, the wiring pattern 60 may be electrically connected to each of the lower electrode layer 40 and the upper electrode layer 50 through a connection part 70, but is not limited thereto. In another example, the wiring pattern 60 may be in direct contact with and electrically connected to each of the lower electrode layer 40 and the upper electrode layer 50. The wiring pattern 60 may include a plurality of conductive lines. The wiring pattern 60 and the connection part 70 may each include a conductive material.

A voltage may be applied to the wiring pattern 60 to generate a potential difference between the upper electrode layer 50 and the wiring pattern 60 and consequently, an electric field may be applied to the target material layer 30. In one example, a polarization state in the target material layer 30 may be changed by the electric field and accordingly, a domain structure of the target material layer 30 may be changed. Changes in domain structure of the target material layer 30 according to the electric field may be observed in real time through the analysis method to be described later.

According to an embodiment of the inventive concept, when the specimen 1 is observed through the analysis method to be described later, the domain structure of the target material layer 30 may be analyzed even though the target material layer 30 is disposed inside a stacked structure of the specimen 1. In other words, the domain structure of the target material layer 30 on an x-y plane may be analyzed even though the target material layer 30 is provided in the specimen 1 stacked in a z direction. Here, the z direction is a direction crossing (for example, perpendicular to) the x-y plane. Moreover, it is not required to cut the target material layer 30 in an x-z plane or y-z plane in order to observe changes in structure of the target material layer 30. Consequently, the target material layer 30 may be analyzed using a non-destructive method in an extending direction of the x-y plane crossing a stacked direction (i.e., the z direction).

Referring to FIG. 3B, the specimen 1 may include the lower insulation layer 45 and the upper insulation layer 55 in FIG. 3A. That is, the lower electrode layer 40 may be in contact with a bottom surface of the target material layer 30, and the upper electrode layer 50 may be in contact with a top surface of the target material layer 30. Although not illustrated, the specimen 1 may include only one of the lower insulation layer 45 and the upper insulation layer 55 in FIG. 3A.

Figure 4:
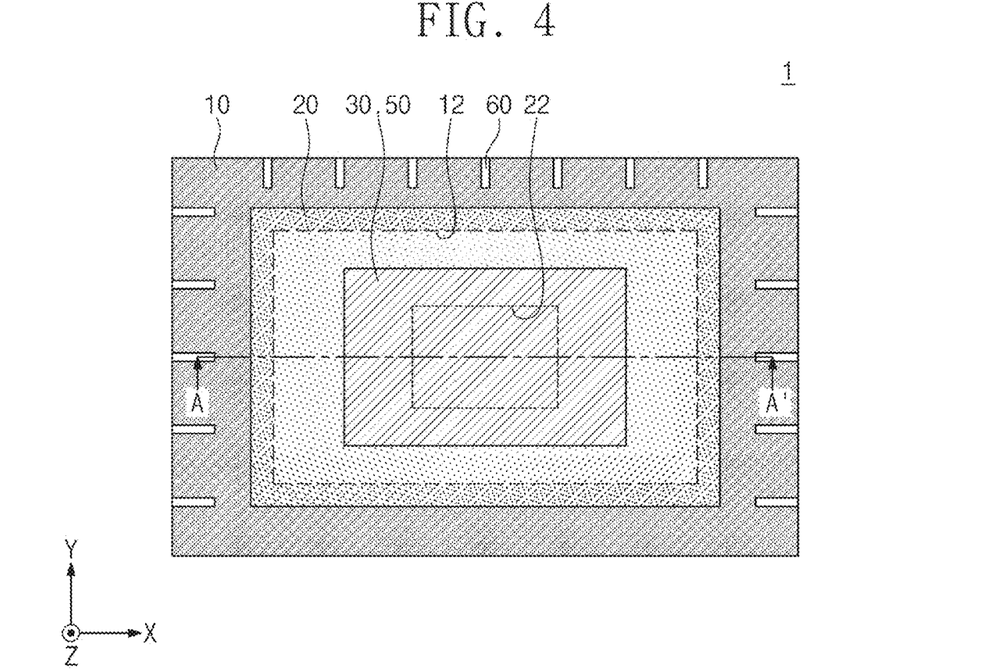
Figure 5:
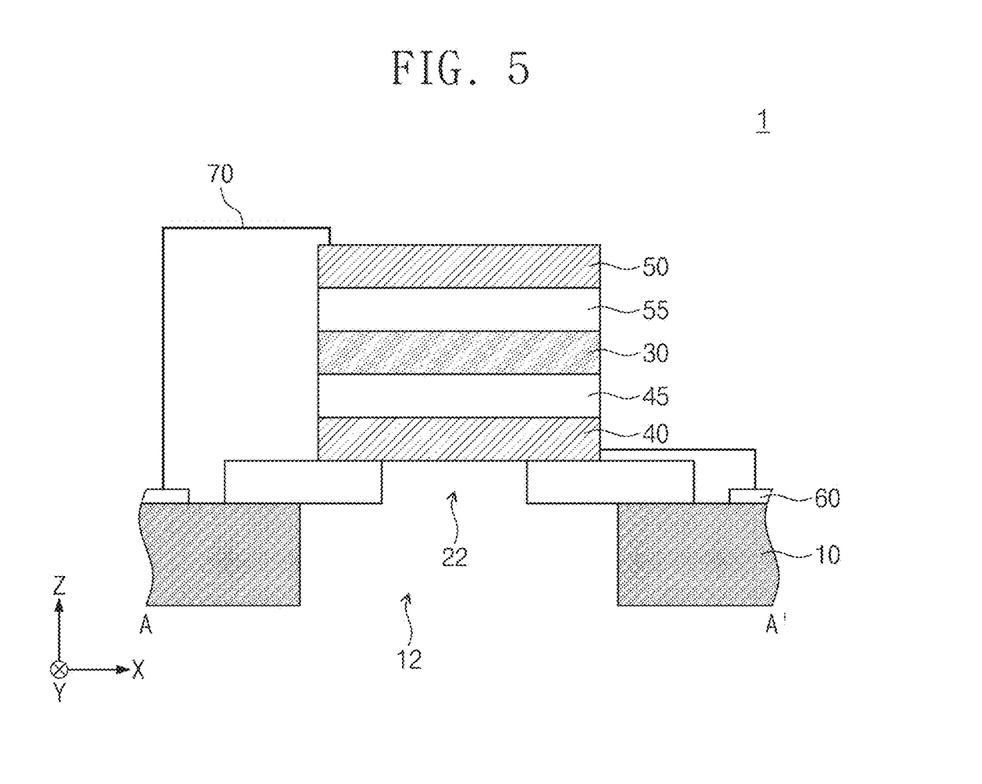
FIG. 5 is a cross-sectional view corresponding to line A-A' in FIG. 4.
Figure 6:
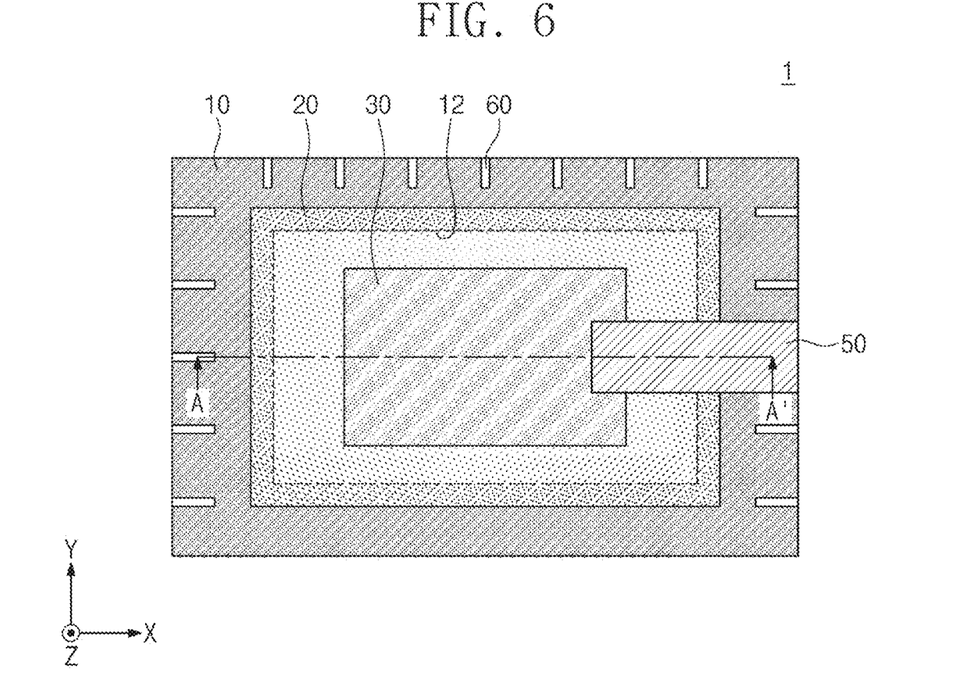
Figure 7:
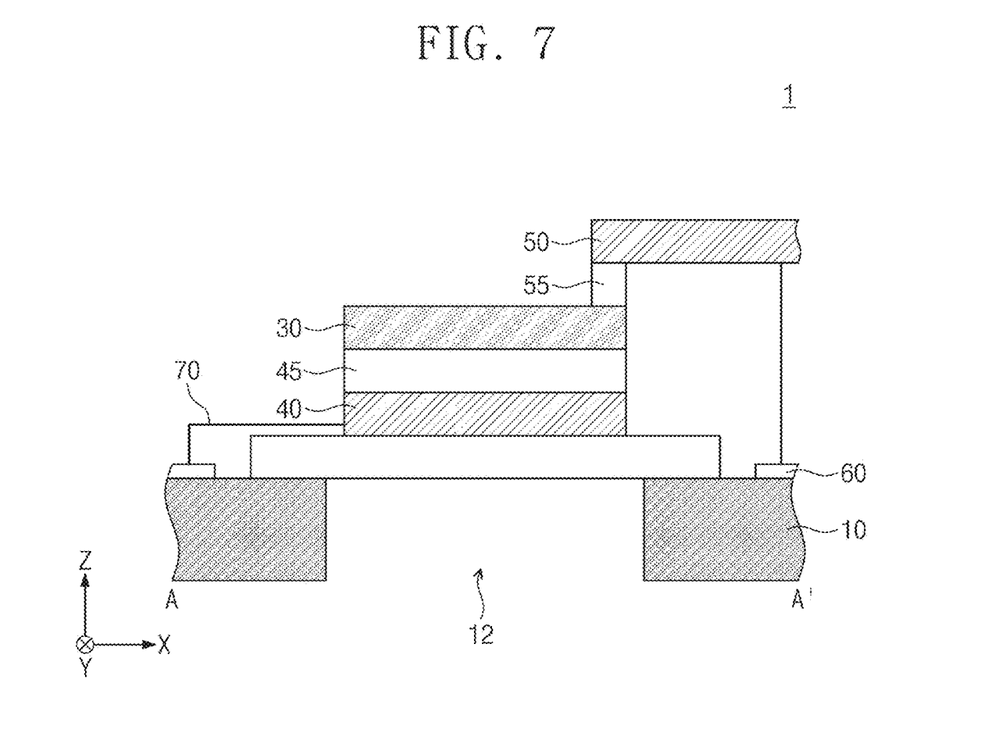
FIG. 7 is a cross-sectional view corresponding to line A-A' in FIG. 6.

FIGS. 4 to 7 are views illustrating a specimen according to an embodiment of the inventive concept. FIGS. 4 and 6 are plan views of a specimen according to an embodiment of the inventive concept. FIGS. 5 and 7 are cross-sectional views corresponding to lines A-A' in FIGS. 4 and 6, respectively. The contents in common with the contents described with reference to FIGS. 1 to 3B will be omitted to avoid redundancy and the description will be focused on differences.

Referring to FIGS. 4 and 5, an upper plate 20 may include an upper opening portion 22 passing therethrough. The upper opening portion 22 may be an empty space extending from a top surface to a bottom surface of the upper plate 20, and may be provided in plurality. The upper opening portion 22 may vertically overlap a lower opening portion 12 and a target material layer 30. For example, the upper opening portion 22 may expose a bottom surface of a lower electrode layer 40 to the outside.

In the analysis method to be described later, an electron beam may pass through the upper plate 20, and may pass through, for example, the upper opening portion 22 of the upper plate 20. As the upper opening portion 22 is disposed in a path of the electron beam, reflection or diffraction of the electron beam by the upper plate 20 may be minimized. Consequently, an image of the target material layer 30 to be analyzed may be more easily obtained during the observation using a microscope.

Referring to FIGS. 6 and 7, the target material layer 30 may have a portion vertically overlapping an upper electrode layer 50. The target material layer 30 may have the other portion vertically non-overlapping the upper electrode layer 50. For example, the target material layer 30 may have a top surface, of which a portion is covered by the upper electrode layer 50, but is not limited thereto. An upper insulation layer 55 may be interposed between the upper electrode layer 50 and the target material layer 30. In one example, the entire area of the upper insulation layer 55 may be interposed between the upper electrode layer 50 and the target material layer 30. In another example, although not illustrated, the upper insulation layer 55 may have a portion, which is interposed between the upper electrode layer 50 and the target material layer 30, and the other portion which is not interposed between the upper electrode layer 50 and the target material layer 30.

In the analysis method to be described later, the electron beam may pass through the target material layer 30. In one example, the electron beam may pass through a region of the target material layer 30, which vertically non-overlaps the upper electrode layer 50. Accordingly, reflection or diffraction of the electron beam by the upper electrode layer 50 may be minimized. Consequently, the image of the target material layer 30 to be analyzed may be more easily obtained during the observation using the microscope.

However, an embodiment of the inventive concept is not limited to each of the embodiments described above. An embodiment of the inventive concept may include embodiments, each of which is a combination of some or all of the characteristics of the embodiments described with reference to FIGS. 1 to 7.

Figure 8:
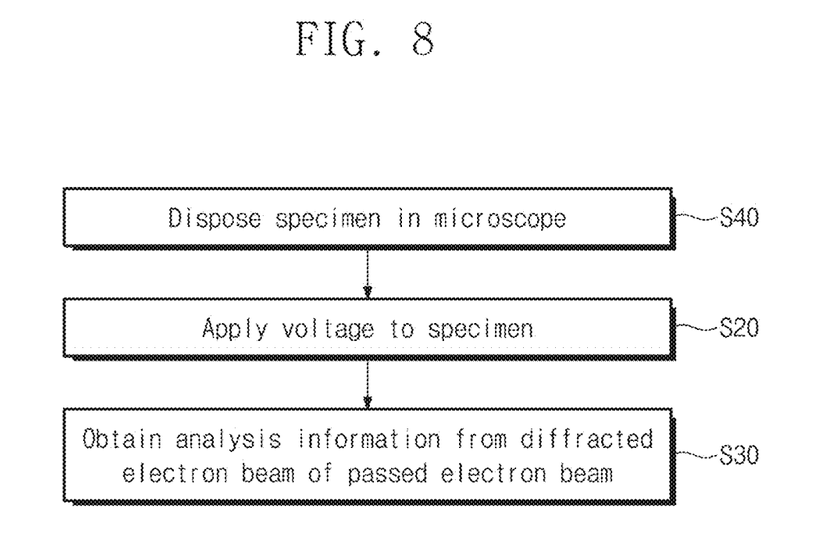
FIG. 8 is a flowchart for explaining an analysis method according to an embodiment of the inventive concept.
Figure 9:
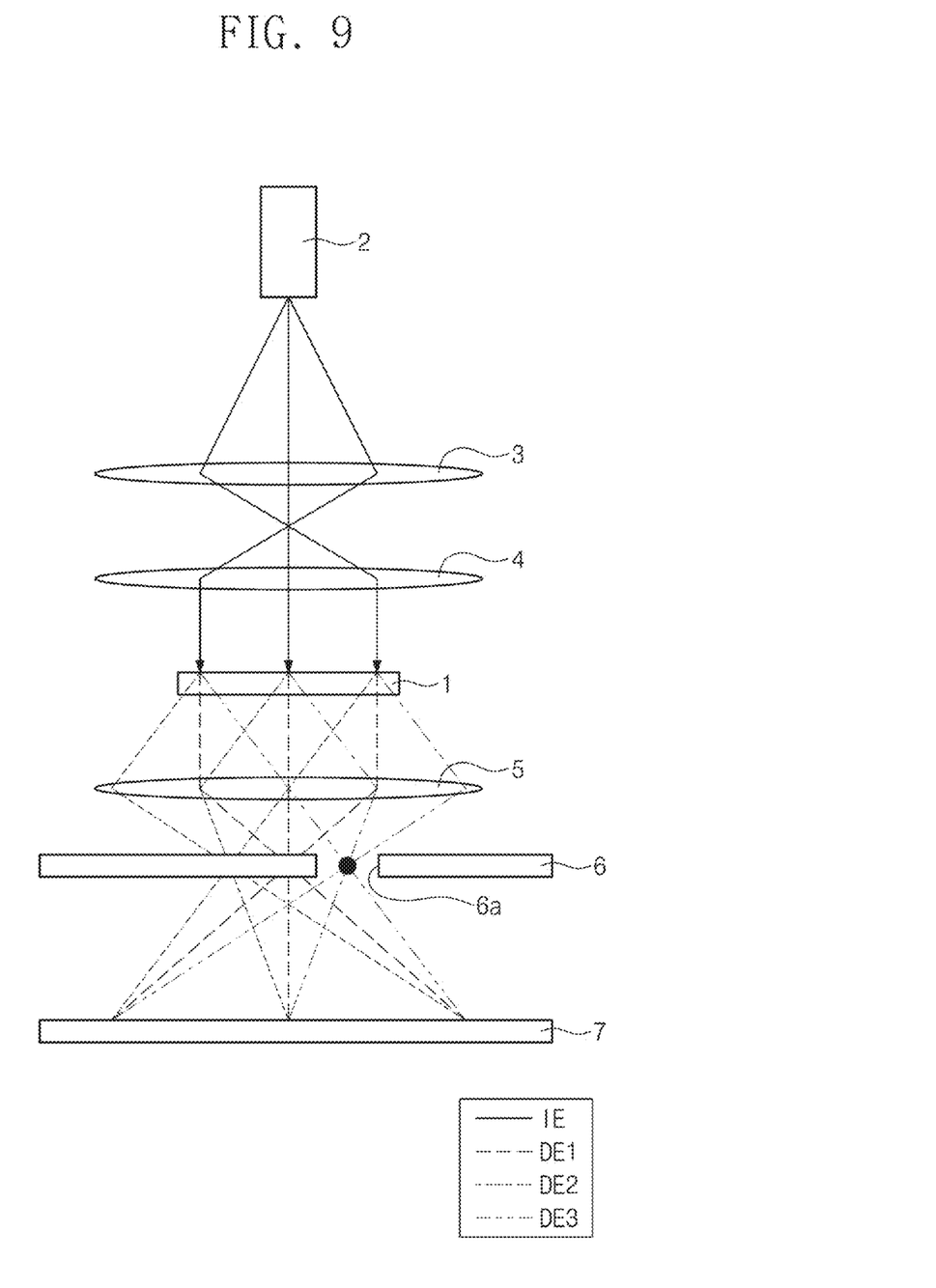
FIG. 9 is a schematic diagram of a microscope for explaining an analysis method according to an embodiment of the inventive concept.
Figure 10:
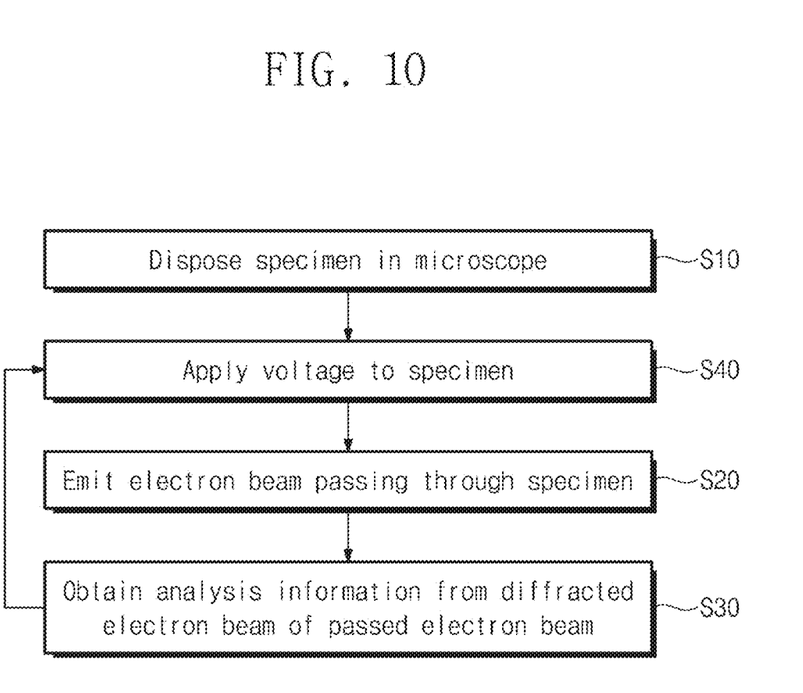
FIG. 10 is a flowchart for explaining an analysis method according to an embodiment of the inventive concept.

FIG. 8 is a flowchart for explaining an analysis method according to an embodiment of the inventive concept. FIG. 9 is a schematic diagram of a microscope for explaining an analysis method according to an embodiment of the inventive concept. FIG. 10 is a flowchart for explaining an analysis method according to an embodiment of the inventive concept. Hereinafter, an analysis method of observing, through a microscope, the specimen described with reference to FIGS. 1 to 7. The contents in common with the contents described above will be omitted to avoid redundancy and the description will be focused on differences.

Referring to FIGS. 8 and 9, a specimen 1 may be disposed in a microscope (S10). The specimen 1 may be substantially the same as the specimen 1 described with reference to FIGS. 1 to 7. The microscope may include an electron gun 2, condenser lenses 3 and 4, an objective lens 5, a focal plane 6, and an image screen 7.

The electron gun 2 may generate an electron beam, and the electron beam may pass through the specimen 1 (S20). In more detail, a voltage may be applied to the electron gun 2 to accelerate an electron, and an initial electron beam IE may be generated. The voltage applied to the electron gun 2 may be about 2 MV or less. The initial electron beam IE generated from the electron gun 2 may be directed towards the specimen 1 through the condenser lenses 3 and 4. The condenser lenses 3 and 4 may collect the initial electron beam IE so that the initial electron beam IE is directed towards the specimen 1.

The initial electron beam IE may pass through layers of the specimen 1 in sequence. In one example, when the specimen 1 in FIG. 3A is provided, the initial electron beam IE may pass through the upper electrode layer 50, the upper insulation layer 55, the target material layer 30, the lower insulation layer 45, the lower electrode layer 40, the upper plate 20, and the lower plate 10 in sequence. Here, the initial electron beam IE may pass through the lower opening portion 12 of the lower plate 10. In another example, when the specimen 1 in FIG. 3B is provided, the initial electron beam IE may pass through the upper electrode layer 50, the target material layer 30, the lower electrode layer 40, the upper plate 20, and the lower plate 10 in sequence. In still another example, when the specimen 1 in FIG. 7 is provided, the initial electron beam IE may pass through the target material layer 30, the lower insulation layer 45, the lower electrode layer 40, the upper plate 20, and the lower plate 10 in sequence. Here, the initial electron beam IE may pass through the upper opening portion 22 of the upper plate 20.

The initial electron beam IE may be diffracted while passing through the specimen 1. The initial electron beam IE may be diffracted by respective materials included in the layers of the specimen. In one example, at least a portion of the initial electron beam IE may be diffracted by the respective materials included in the layers of the specimen. The initial electron beam IE passes through the specimen 1 and then, the at least a portion of the passed electron beam may be divided into a plurality of diffracted electron beams DE1, DE2 and DE3 according to the respective materials of the layers in the specimen 1, which cause diffraction. The number of the diffracted electron beams DE1, DE2 and DE3 is not limited, but the diffracted electron beams DE1, DE2 and DE3 will be defined and described as first to third diffracted electron beams DE1, DE2 and DE3 for convenience of explanation. In one example, the first diffracted electron beam DE1 may refer to electron beams that are diffracted by the target material layer 30 in the same direction. In another example, the second diffracted electron beam DE2 may refer to electron beams that are diffracted by a layer (e.g., the lower electrode layer 40) other than the target material layer 30 in the same direction, and the direction in which the second diffracted electron beam DE2 is diffracted may be different from the direction in which the first diffracted electron beam DE1 is diffracted. In still another example, the third diffracted electron beam DE3 may refer to electron beams that are diffracted by a layer (e.g., the upper electrode layer 50) other than the target material layer 30 in the same direction, and the direction in which the third diffracted electron beam DE3 is diffracted may be different from the direction in which each of the first and second diffracted electron beams DE1 and DE2 is diffracted. When the target material layer 30 is intended to be observed, an analysis of the first diffracted electron beam DE1 is required. Accordingly, it may require an operation of filtering the first and second diffracted electron beams DE1 and DE2 to observe the target material layer 30.

Thereafter, analysis information of the target material layer 30 may be obtained from the diffracted electron beams DE1, DE2 and DE3 of the passed electron beam (S30). For example, a filtering operation may be performed on the diffracted electron beams DE1, DE2 and DE3.

In one example, in more detail, the objective lens 5 may collect the first to third diffracted electron beams DE1, DE2 and DE3 on the same regions of the focal plane 6, respectively. For example, the electron beams constituting the first diffracted electron beam DE1 may be collected on one region of the focal plane 6. Likewise, the electron beams constituting the second diffracted electron beams DE2 may be collected on another region of the focal plane 6, and the electron beams constituting the third diffracted electron beams DE3 may be collected on still another region of the focal plane 6.

The focal plane 6 may include a diffraction opening portion 6a, and the diffraction opening portion 6a may be provided in plurality. Here, the first diffracted electron beam DE1 requiring the analysis may be collected in the diffraction opening portion 6a of the focal plane 6. The first diffracted electron beam DE1 may pass through the focal plane 6 via the diffraction opening portion 6a. Each of the second and third diffracted electron beams DE2 and DE3 may be collected on a region other than the diffraction opening portion 6a of the focal plane 6. The second and third diffracted electron beams DE2 and DE3 may fail to pass through the focal plane 6. Accordingly, only the first diffracted electron beam DE1 of the plurality of diffracted electron beams DE1, DE2 and DE3 may pass through the focal plane 6 toward the image screen 7. The information of the target material layer 30 may be analyzed based on a diffraction pattern of the first diffracted electron beam DE1, which is formed on the image screen 7.

However, an embodiment of the inventive concept is not limited to the filing method above, and various filtering methods may be used unrestrictedly within a range in which those skilled in the art could easily modify the filing methods.

Referring to FIGS. 9 and 10, emitting an electron beam (S20) and obtaining analysis information (S30) may be repeatedly performed on one specimen 1. Accordingly, the analysis information of the target material layer 30 may be obtained multiple times. For example, applying a voltage to the specimen 1 (e.g., the lower electrode layer 40 and the upper electrode layer 50) (S40) may be further performed when repeating the emitting of the electron beam (S20) and the obtaining of the analysis information (S30).

In one example, the voltage may be continuously applied to each of the lower electrode layer 40 and the upper electrode layer 50 of the specimen 1 when repeating the emitting of the electron beam (S20) and the obtaining of the analysis information (S30). The voltage applied to each of the lower electrode layer 40 and the upper electrode layer 50 may change in magnitude and direction according to time. Accordingly, an electric field formed in each of the lower electrode layer 40 and the upper electrode layer 50 may cause continuous changes in domain structure of the target material layer 30, and the changes in domain structure of the target material layer 30 may be analyzed in real time.

In another example, the voltage may be discontinuously applied to each of the lower electrode layer 40 and the upper electrode layer 50 of the specimen 1 when repeating the emitting of the electron beam (S20) and the obtaining of the analysis information (S30). For example, the voltage may be temporarily applied to each of the lower electrode layer 40 and the upper electrode layer 50 after the obtaining of the analysis information (S30), and the voltage may be removed before the electron beam is re-emitted (S20). Accordingly, an electric field formed in each of the lower electrode layer 40 and the upper electrode layer 50 may cause changes in domain structure of the target material layer 30, and the changes in domain structure of the target material layer 30 may be analyzed.

According to an embodiment of the inventive concept, when the electric field is generated in the z direction, the changes in domain structure of the target material layer 30 on the x-y plane may be analyzed in real time. Consequently, it may be easily to analyze the real-time structural change, etc., under the actual driving environment of semiconductor devices, etc.

According to an embodiment of the inventive concept, in the microscope specimen having the stacked structure, the target material layer disposed in the stacked structure of the specimen may be analyzed using the non-destructive method. When the electric field is formed with respect to the target material layer in the stacked direction, the changes in the target material layer in the extending direction of the plane crossing the stacked direction may be analyzed in real time. Consequently, it may be easy to analyze the real-time structural changes, etc., under the actual driving environment of semiconductor devices, etc.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A microscopic specimen comprising:
a lower plate including a lower opening portion;
an upper plate configured to cover the lower opening portion;
a target material layer on the upper plate;
a lower electrode layer between the upper plate and the target material layer;
an upper electrode layer on the target material layer; and
a wiring pattern electrically connected to each of the upper electrode layer and the lower electrode layer.

2. The microscopic specimen of claim 1, wherein the target material layer vertically overlaps the lower opening portion.

3. The microscopic specimen of claim 1, wherein the upper plate comprises an upper opening portion,
wherein the target material layer vertically overlaps the upper opening portion.

4. The microscopic specimen of claim 1, wherein at least a portion of the upper electrode layer vertically overlaps the target material layer.

5. The microscopic specimen of claim 1, wherein the upper plate has a thickness that is greater than about 0 nm and less than or equal to about 300 nm.

6. The microscopic specimen of claim 1, wherein the target material layer comprises at least one of a chalcogenide, a metal oxide, a nitride, graphene, and graphite.

7. The microscopic specimen of claim 1, wherein the target material layer has a thickness that is greater than about 0 nm and less than or equal to about 300 nm.

8. The microscopic specimen of claim 1, wherein each of the upper electrode layer and the lower electrode layer has a thickness that is greater than about 0 nm and less than or equal to about 300 nm.

9. The microscopic specimen of claim 1, wherein each of the lower electrode layer and the upper electrode layer comprises at least one of a monocrystalline material and an amorphous material.

10. The microscopic specimen of claim 1, further comprising at least one of a lower insulation layer and an upper insulation layer,
wherein the lower insulation layer is interposed between the target material layer and the lower electrode layer, and the upper insulation layer is interposed between the target material layer and the upper electrode layer.

11. The microscopic specimen of claim 10, wherein each of the lower insulation layer and the upper insulation layer comprises at least one of a monocrystalline material and an amorphous material.

12. An analysis method comprising:
a process (a) of disposing a specimen in a microscope;
a process (b) of emitting an electron beam passing through the specimen; and
a process (c) of obtaining analysis information from a diffracted electron beam of the passed electron beam,
wherein the specimen comprises:
a lower plate including a lower opening portion;
an upper plate configured to cover the lower opening portion;
a target material layer on the upper plate; and
a lower electrode layer between the upper plate and the target material layer,
wherein, in the process (b), the electron beam passes through the target material layer, the lower electrode layer, the upper plate, and the lower plate in sequence.

13. The analysis method of claim 12, wherein, in the process (b), the electron beam passes through the lower opening portion of the lower plate.

14. The analysis method of claim 12, wherein the upper plate comprises an upper opening portion,
wherein, in the process (b), the electron beam passes through the upper opening portion of the upper plate.

15. The analysis method of claim 12, wherein the specimen further comprises an upper electrode layer on the target material layer,
wherein at least a portion of the upper electrode layer vertically overlaps the target material layer.

16. The analysis method of claim 15, wherein, in the process (b), the electron beam further passes through the upper electrode layer.

17. The analysis method of claim 12, wherein the process (b) and the process (c) are alternately and repeatedly performed.

18. The analysis method of claim 17, further comprising a process (d) of applying a voltage to the lower electrode layer,
wherein, in the process (d), the voltage is continuously applied while the process (b) and the process (c) are repeatedly performed.

19. The analysis method of claim 17, further comprising a process (d) of applying a voltage to the lower electrode layer,
wherein the process (d) is performed after performing the process (c) and before reperforming the process (b).

20. The analysis method of claim 12, wherein the process (b) comprises accelerating an electron by a voltage of about 2 MV or less to generate the electron beam.

* * * * *